US006949765B2

(12) United States Patent
Song et al.

(10) Patent No.: US 6,949,765 B2
(45) Date of Patent: Sep. 27, 2005

(54) PADLESS STRUCTURE DESIGN FOR EASY IDENTIFICATION OF BRIDGING DEFECTS IN LINES BY PASSIVE VOLTAGE CONTRAST

(75) Inventors: Zhigang Song, Singapore (SG); Shailesh Redkar, Singapore (SG); Chong Khiam Oh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 64 days.

(21) Appl. No.: 10/288,193

(22) Filed: Nov. 5, 2002

(65) Prior Publication Data

US 2004/0084671 A1 May 6, 2004

(51) Int. Cl.[7] .......... H01L 23/58

(52) U.S. Cl. .......... 257/48; 257/919; 257/911; 438/4; 438/10; 438/12; 324/758; 324/751; 250/310; 250/311

(58) Field of Search .......... 257/48, 919, 911; 438/10, 11, 12, 17, 18, 926, 4, 14; 324/758, 751; 250/310, 311

(56) References Cited

U.S. PATENT DOCUMENTS 4,855,253 A 8/1989 Weber .......... 437/8
5,159,752 A 11/1992 Mahant-Shetti et al. .......... 29/846
5,817,533 A 10/1998 Sen et al. .......... 438/4
5,959,459 A * 9/1999 Satya et al. .......... 324/751
6,001,663 A 12/1999 Ling et al. .......... 438/17
6,201,124 B1 3/2001 Dotan et al. .......... 250/310
6,204,075 B1 * 3/2001 Kikuchi .......... 438/18
6,236,222 B1 5/2001 Sur, Jr. et al. .......... 324/758
6,636,064 B1 10/2003 Satya et al. .......... 324/763
6,734,687 B1 * 5/2004 Ishitani et al. .......... 324/751
6,771,077 B2 * 8/2004 Hamamura et al. .......... 324/537

* cited by examiner

*Primary Examiner*—Nathan J. Flynn
*Assistant Examiner*—Remmon R. Fordé
(74) *Attorney, Agent, or Firm*—George D. Saile; Rosemary L.S. Pike; Douglas R. Schnabel

(57) ABSTRACT

A new test structure to locate bridging defects in a conductive layer of an integrated circuit device is achieved. The test structure comprises a line comprising a conductive layer overlying a substrate. The line is coupled to ground. A plurality of rectangles comprises the conductive layer. The rectangles are not connected to the line or to other rectangles. Near edges of the rectangles and of the line are parallel. The rectangles are floating. The test structure is used with a passive voltage contrast test in a scanning electron microscope. A test structure and method to measure critical dimensions is disclosed.

25 Claims, 6 Drawing Sheets

PADLESS STRUCTURE DESIGN FOR EASY IDENTIFICATION OF BRIDGING DEFECTS IN LINES BY PASSIVE VOLTAGE CONTRAST

BACKGROUND OF THE INVENTION (1) Field of the Invention

The invention relates to a test structure and method to locate bridging defects in an integrated circuit device, and, more particularly, to a test structure and method to locate bridging defects and to monitor critical dimensions using passive voltage contrast without probing.

(2) Description of the Prior Art

Integrated circuit device manufacture requires the formation of material films on the surface of a wafer substrate. These material films are deposited and then patterned. Typical patterning techniques employ a photolithographic step (photo) and an etching step (etch) as is well known in the art. For example, in the formation of the metal interconnect level, a metal material such as aluminum is deposited over the substrate. A photo step is then used to form a patterned photoresist mask overlying the metal. An etch step is then performed where the metal is exposed to an etching atmosphere. The metal layer is etched through where exposed by the masking layer but not etched where protected by the masking layer. In this way, the metal is patterned to form the intended interconnect design for the metal level of the device.

Following the etching step, it is typical in the art to perform an inspection. Until recently, this inspection, called an after etch (AE) inspection, would be performed using an automated visual inspection system. This inspection system would optically analyze the AE wafer and compare the pattern to the design data.

A recent innovation is the use of the scanning electron microscope (SEM) to provide additional AE inspection information. A SEM works by scanning an area of the wafer with an incident, or primary, electron beam. A receiver in the SEM then captures secondary emitted electrons from the wafer. The captured emitted electrons are then analyzed with respect to the scanning beam to generate a visual image of the wafer surface.

Of particular interest for the present invention is a phenomenon of SEM imaging of integrated circuits called passive voltage contrast (PVC). PVC occurs when the SEM low-energy, primary electron beam strikes a conductive layer, such as metal or polysilicon. It has been found that conductive lines that are coupled to ground will emit a large amount of secondary electrons. Conversely, conductive lines that are floating will exhibit much lower electron emission. Therefore, ground interconnect lines will appear as bright lines on the SEM image screen while floating will appear as dark lines.

Referring now to FIG. 1, a conventional, interconnect layer, test structure is shown. This test structure is used for detecting bridging defects. The test structure comprises a patterned conductive layer 14 overlying a region of the substrate 10. The layer 14 is patterned to form a comb structure. The comb structure comprises a first network 18 of interconnected polygons originating at PAD A 24 and a second network 22 of interconnected polygons originating at the PAD B 26. The comb structure is further defined by interleaving of the first and second networks 18 and 22 such that parallel conductive lines are generated using the minimum spacing for the process.

After etching, the test structure can be electrically tested by probing both PAD A 24 and PAD B 26. A high resistance value between PAD A 24 and PAD B 26 indicates that the etching process for the conductive layer 14 has been complete such that the first network 18 and the second network 22 are independent. A low resistance value between PAD A 24 and PAD B 26 indicates that a short circuit exists between the networks 18 and 22. A typical cause for such a short circuit is incomplete etching of the conductive layer 14 that results in a bridging defect between the networks.

Referring now to FIG. 2, a SEM may be used to analyze the test structure using the PVC effect. In this case, the after etch wafer is loaded into the SEM system. For example, PAD B 26 is probed so that it can be coupled to ground. PAD A 24 is left floating. The PVC test is run by scanning a low-energy, primary electron beam on both first network 18 and second network 22. The first network 18 should remain dark where no bridging defect exists. However, the second network 22 will glow due to the defect. In this way, the PVC test can be used to detect if a bridging defect has occurred.

The prior art test structure has a serious limitation, however. As discussed above, the comb structure is formed by continuous, parallel lines. If a bridging defect occurs, then all of the parallel lines will be glowing. It is very difficult to visually identify the location of the defect 30, which can be very small, due to so much light emission from the rest of the structure. It is desirable to be able to precisely locate the bridging defect 30 for further failure analysis of the defect. For example, the defect can be cross-sectioned and analyzed using the SEM. However, this cross-sectioning must be performed at the exact location of the defect. In addition, the location of the defect can tell the process engineer important information about the operation of the photo or etching processes. Providing a test structure with an improved capability for both detecting and locating a bridging defect is an important focus of the present invention.

Several prior art inventions relate to passive voltage contrast and methods to detect processing errors in an integrated circuit device. U.S. Pat. No. 6,236,222 B1 to Sur, Jr. et al discloses a method to detect metal to via misalignments using passive voltage contrast (PVC) on a scanning electron microscope (SEM). A test structure is disclosed. U.S. Pat. No. 6,201,240 B1 to Dotan et al describes a method and an apparatus to enhance SEM imaging using narrow energy banding. U.S. Pat. No. 6,001,663 to Ling et al teaches a method and structure to detect defect sizes in polysilicon and source-drain devices. A double bridge, test structure is implemented using resistor paths comprising various structures. Defect size can be determined by measuring resistivity. U.S. Pat. No. 4,855,253 to Weber discloses a method to detect random defects in an integrated circuit device.

SUMMARY OF THE INVENTION

A principal object of the present invention is to provide an effective and very manufacturable test structure and method to locate interconnect defects in an integrated circuit device.

A further object of the present invention is to provide a test structure for locating bridging defects in an interconnect layer using PVC.

A yet further object of the present invention is to provide a test structure for locating bridging defects that is effective for conductive levels patterned by etching or by chemical mechanical polishing.

A further object of the present invention is to provide a method to detect bridging defects using PVC and a novel test structure.

A yet further object of the present invention is to provide a testing method that does not require probing.

A further object of the present invention is to provide a test structure for measuring critical dimensions in a conductive layer using PVC.

A yet further object of the present invention is to provide a method to measure critical dimensions in a conductive layer using a novel test structure.

A yet further object of the present invention is to provide a test structure and method for measuring critical dimensions using PVC that is effective for conductive levels patterned by etching or by chemical mechanical polishing.

In accordance with the objects of this invention, a test structure to locate bridging defects in a conductive layer of an integrated circuit device is achieved. The test structure comprises a line comprising a conductive layer overlying a substrate. The line is coupled to ground. A plurality of rectangles comprises the conductive layer. The rectangles are not connected to the line or to other rectangles. Near edges of the rectangles and of the line are parallel. The rectangles are floating.

Also in accordance with the objects of this invention, a method to locate bridging defects in a conductive layer of an integrated circuit device is achieved. The method comprises providing a conductive layer overlying a substrate. The conductive layer is patterned to form lines and to form a test structure. The test structure comprises a line comprising a conductive layer overlying the substrate. The line is coupled to ground. A plurality of rectangles comprises the conductive layer. The rectangles are not connected to the line or to other rectangles. Near edges of the rectangles and of the line are parallel. Near edges are spaced by a constant value. The rectangles are floating. The test structure is exposed to an electron beam. Secondary electron emissions from the test structure are monitored to locate line defects by passive voltage contrast.

Also in accordance with the objects of this invention, a method to measure critical dimensions in a conductive layer of an integrated circuit device is achieved. The method comprises providing a conductive layer overlying a substrate. The conductive layer is patterned to form lines and to form a test structure. The test structure comprises a line comprising a conductive layer overlying the substrate. The line is coupled to ground. A plurality of rectangles comprises the conductive layer. The rectangles are not connected to the line or to other rectangles. Near edges of the rectangles and of the line are parallel. The near edges are spaced by non-constant values. The rectangles are floating. The test structure is exposed to an electron beam. Emitted secondary electrons are captured from the test structure to locate a short in the test structure by passive voltage contrast. The critical dimension is determined as the smallest space without a short.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a test structure for detecting bridging defects in a conductive layer of an integrated circuit device using passive voltage contrast (PVC). The novel test structure facilitates precise location of bridging defects. A method to detect defects using the novel structure is disclosed. The method is useful for conductive levels defined by etching or by polishing. Further, a test structure and method are disclosed for using PVC to measure a critical dimension (CD) of a conductive layer. Again, this method may be used for a metal layer defined by etching or by polishing. It should be clear to those experienced in the art that the present invention can be applied and extended without deviating from the scope of the present invention.

Figure 1:
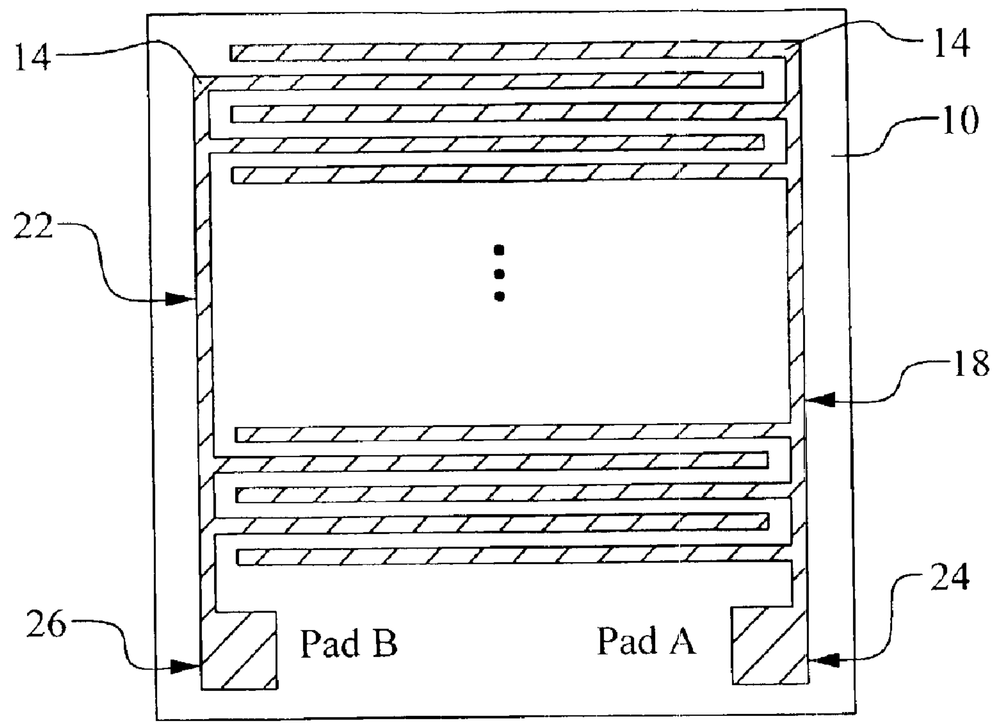
FIGS. 1 and 2 illustrate a conventional test structure for detecting bridging defects in a patterned, conductive layer in an integrated circuit device.
Figure 2:
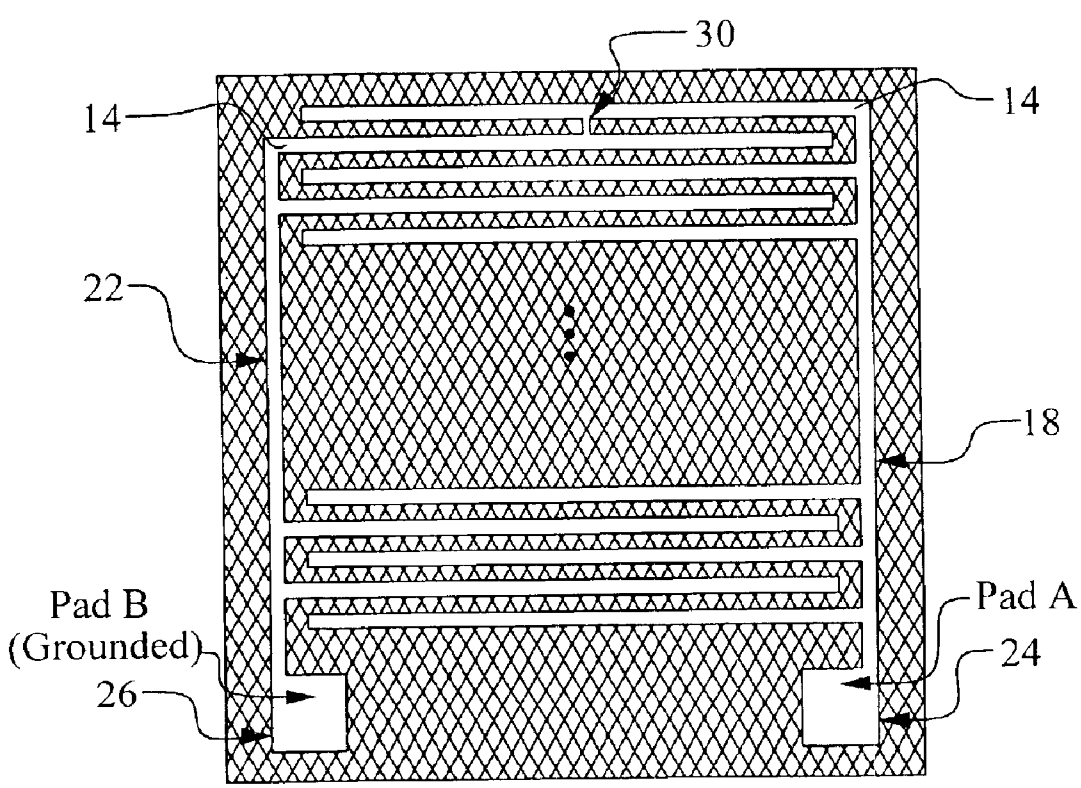
Figure 3:
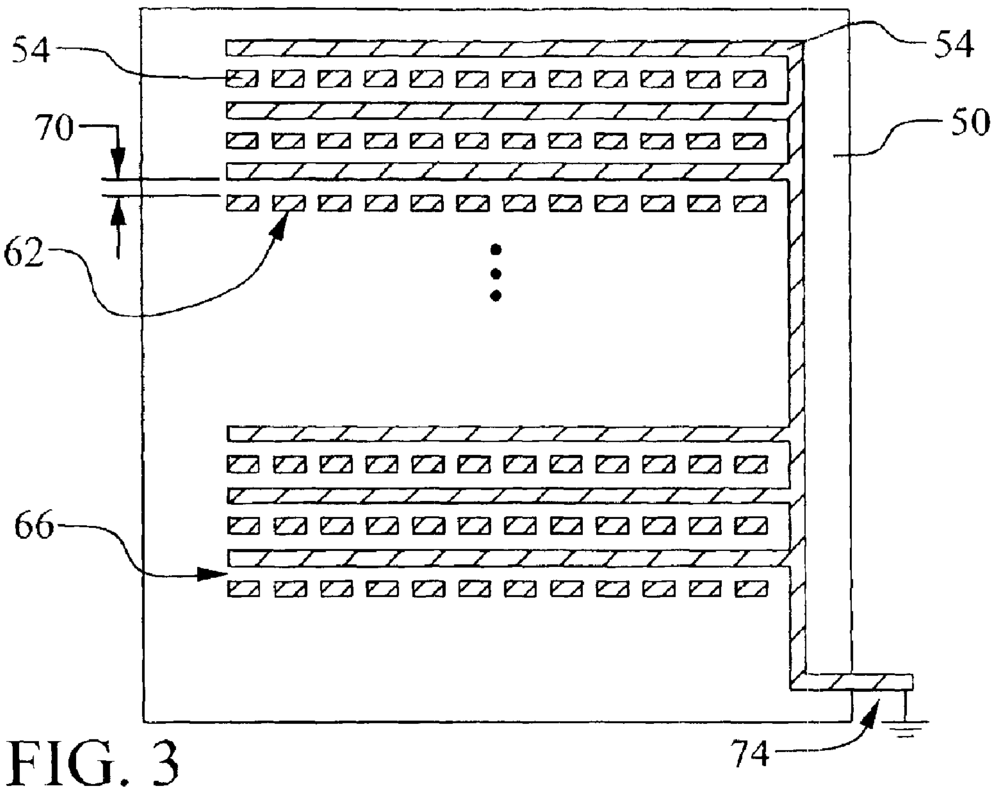
FIGS. 3 and 4 illustrate a first preferred embodiment of the present invention showing a novel test structure for locating bridging defects.
Figure 4:
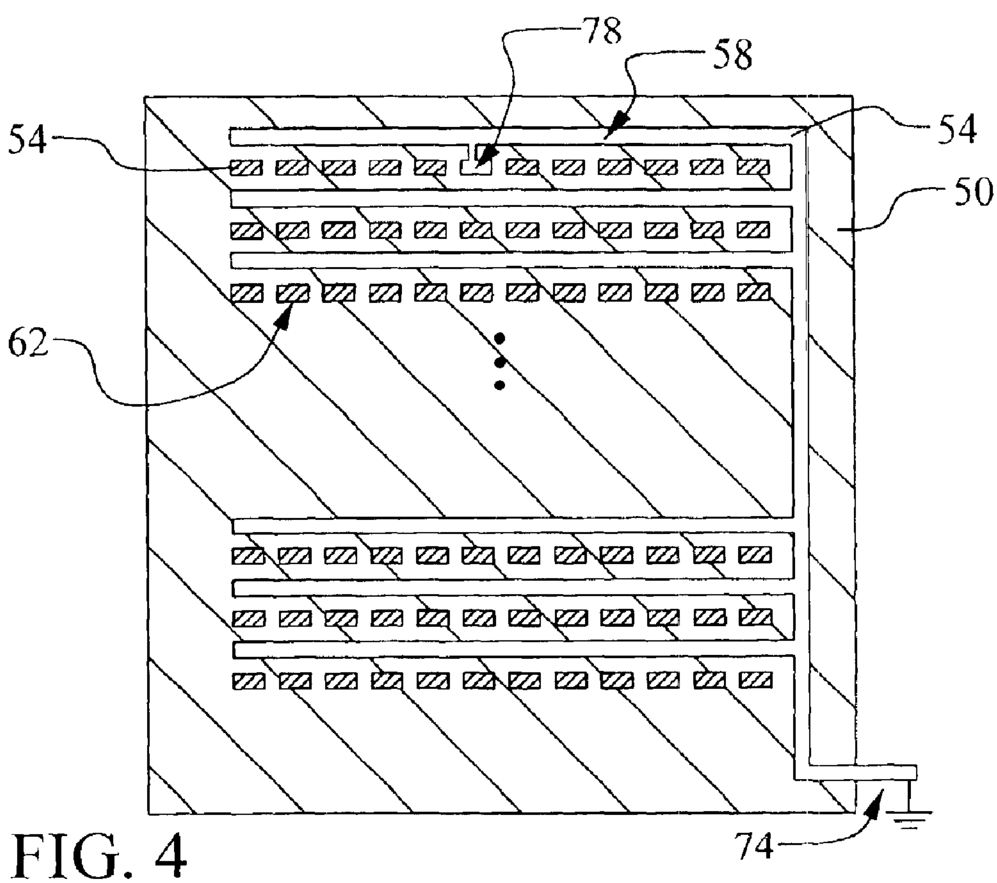

Referring now to FIGS. 3 and 4, a first preferred embodiment of the present invention is illustrated. A novel test structure for locating bridging defects is disclosed. Several important features of the present invention are shown and discussed below.

Referring particularly to FIG. 3, the novel test structure comprises a single, conductive layer 54. As a first important feature, a line 58 is patterned in this conductive layer 54. The line 58 preferably further comprises a network such as the two-dimensional branching pattern shown. In this branching pattern 58, a series of lines are commonly coupled such that the entire pattern 58 is coupled to ground 74. This ground coupling 74 may be formed in the conductive layer 54 only or may comprise contact or via structures along with additional levels of interconnect material. In a simplest embodiment, a single line could be coupled to ground to form the line 58 portion of the structure.

As a second important feature, a plurality of rectangles 62 are patterned in the conductive layer 54. These rectangles 62 are designed to be non-connected with each other and with the line network 58. That is, each rectangle 62 is an island. Therefore, each rectangle is floating with respect to the ground reference 74 of the circuit. In addition, the rectangles 62 and the lines 58 are closely spaced. The near edges, that is the closest edges of each rectangle 62 and it nearest, adjacent line or lines 58, are formed in parallel 66. Finally, the distance 70 between the near edges of the rectangles and the line or lines 58 are preferably a constant value and, more preferably, equal to the minimum spacing value for the conductive layer in the manufacturing process.

The novel test structure of the first preferred embodiment may comprise any conductive material. For example, the conductive layer 54 may comprise a metal layer such as aluminum, copper, or an alloy of aluminum and/or copper. Other metals or composite materials could be used. Further, such a conductive layer could be patterned using either etching or polishing. For example, a metal film may be deposited over a dielectric material. A masking layer, such as photoresist, is then pattered by a photolithographic sequence wherein the photoresist is coated, exposed to actinic light through a reticle, and developed. An etching process is then used to etch through the metal film where exposed by the patterned masking layer. The masking layer is then removed to reveal the test structure. This would constitute a metal layer defined by etching.

Alternatively, the metal layer may be defined by polishing as in a damascene process. For example, a dielectric layer may be deposited overlying the substrate. This dielectric layer is then patterned using the above-described photolithographic process to define a masking layer. An etching process then creates trenches in the dielectric layer where the dielectric layer is exposed by the patterned masking layer. The masking layer is then removed. A metal film is then deposited overlying the dielectric layer and filling the trenches. Finally, the metal film is polished down to the dielectric layer surface such that the metal only remains in the trenches. The metal lines are thereby defined. The above-described etching method and polishing method are well known in the art.

A further preferred material for the conductive layer 54 is polysilicon. Polysilicon is frequently used in the art to define MOS gates, resistors, and interconnecting lines. Polysilicon and, more preferably, doped polysilicon is a conductor. It is therefore possible to analyze a polysilicon pattern using the PVC method.

The test structure is preferably designed into the masking reticle for the conductive layer 54. For example, the test structure may be designed into the polysilicon mask. Alternatively, the test structure may be designed into any of the metal masks in the process.

Referring now to FIG. 4, an exemplary test result using the novel testing structure is shown. In this example, the conductive layer 54 is patterned using the etching method described above. Following the etching step, the wafer is loaded into a SEM system. Further, the wafer is grounded. Note that the grounding 74 on the test structure is configured such that grounding the substrate will result in grounding the line network 58 of the test structure. This is an important feature of the present invention. It is not necessary to probe the integrated circuit device during the test. The test structure is then exposed to a low-energy, primary electron beam. Emitted secondary electrons are captured and converted into an image by the SEM. The PVC effect, as described above, causes the grounded line network 58 to light or glow on the image. If the etching process has completed successfully, then only the line network 58 will be lit. The rectangles 62 will remain dark.

However, a bridging defect may have been formed in the etching process. The bridging defect forms where the conductive layer 54 has not been completely etched through to separate the line network 58 from a rectangle 78. This incomplete etching will form a bridging defect that shorts the line 58 to the rectangle 78. Here, the advantage of the novel structure is seen. Because each rectangle 62 is isolated from the other rectangles 62 in the array, the bridging defect only shorts between the local rectangle 78 and the line 58. Therefore, only a single rectangle 78 glows. The other rectangles 62 remain dark. It is therefore very easy to precisely locate the bridging defect. This makes further analysis of the test structure, including cross-sectioning, much easier. It is possible for a bridging defect to short more than one rectangle if the defect is large. Again, however, only the rectangles that are shorted will be lit. It is still easy to locate the defect.

The technique allows any bridging defect to be quickly detected and located without an electrical evaluation. In this way, the test is non-invasive. Any time the integrated circuit is probed, there is a chance of damage or contamination. Further, the requirement to electrically test for a defect, first, and then to attempt to scan for the cause means that the prior art test method requires significant additional time and money. Further, the prior art process is not well-suited as an inline test due to its deficiencies. By comparison, the present invention provides a test structure and method that can be used in the line with the production process. The PVC test can be quickly performed, without probing, to provide direction for the process engineer and to provide significant root cause analysis.

Figure 5:
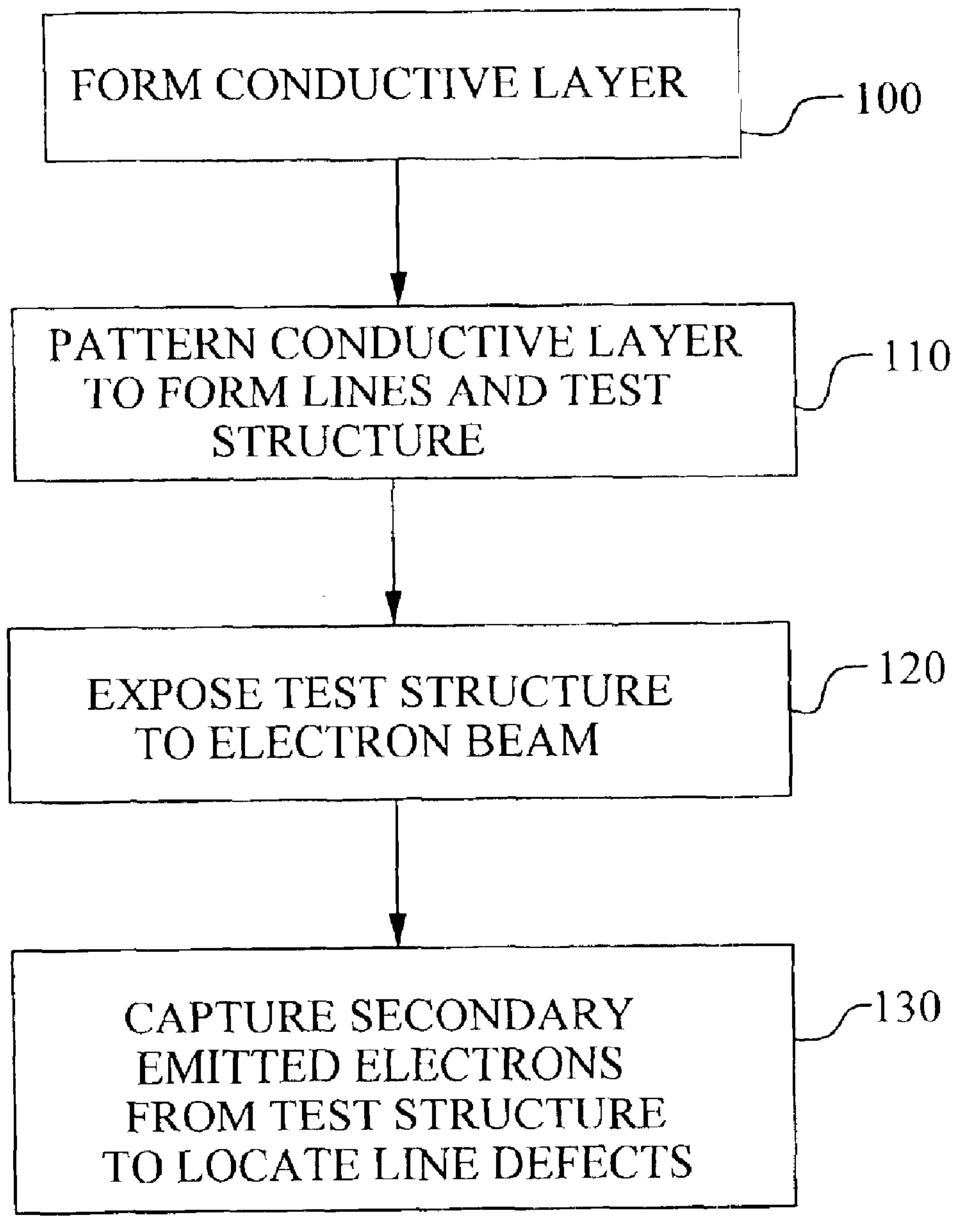
FIG. 5 illustrates a second preferred embodiment of the present invention showing a novel test method to locate bridging defects.

Referring now to FIG. 5, a second preferred embodiment of the present invention shows the novel test method to locate bridging defects as a process flow. First, a conductive layer is formed overlying the substrate in step 100. Second, this conductive layer is patterned in step 110. This patterning may be by etching or by damascene polishing. During the patterning step 110, the conductive lines of the circuit are formed as well as the novel test structure of the present invention. Third, the test structure is exposed to an electron beam in step 120. This step is preferably performed in a type of SEM system. The exposure most preferably involves scanning the electron beam on the test structure. Finally, emitted secondary electrons are captured and converted to a video image to locate line defects in step 130.

Figure 6:
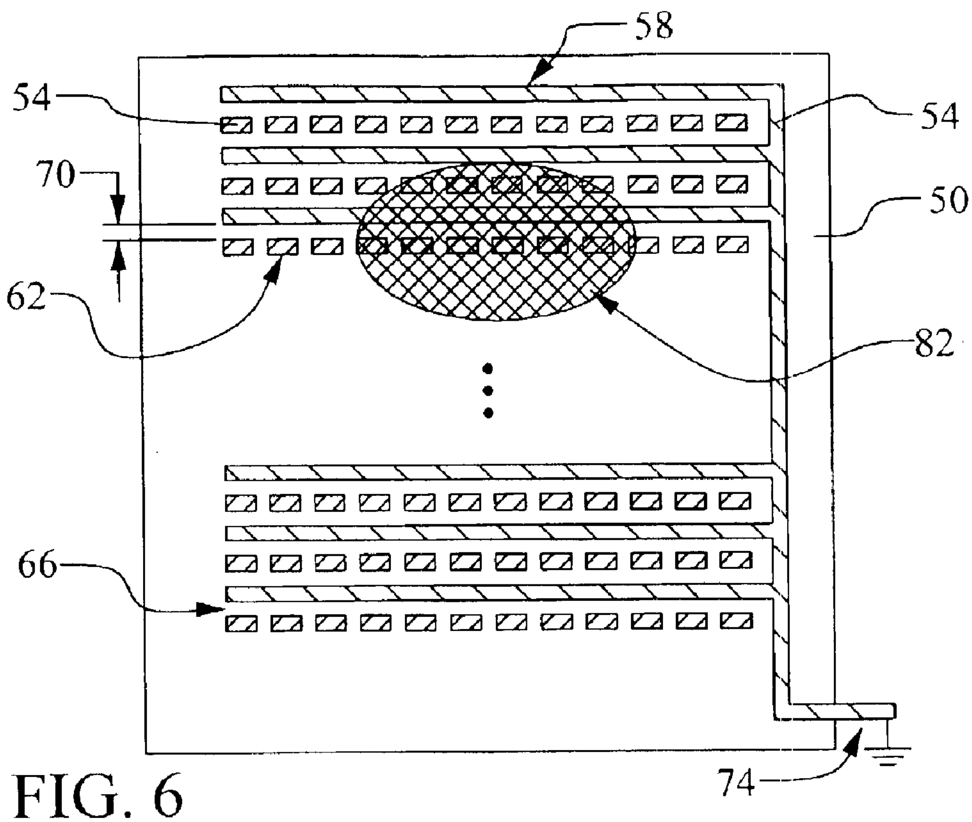
FIGS. 6 and 7 illustrates the first preferred embodiment applied to a damascene process where the conductive layer is defined by polishing.
Figure 7:
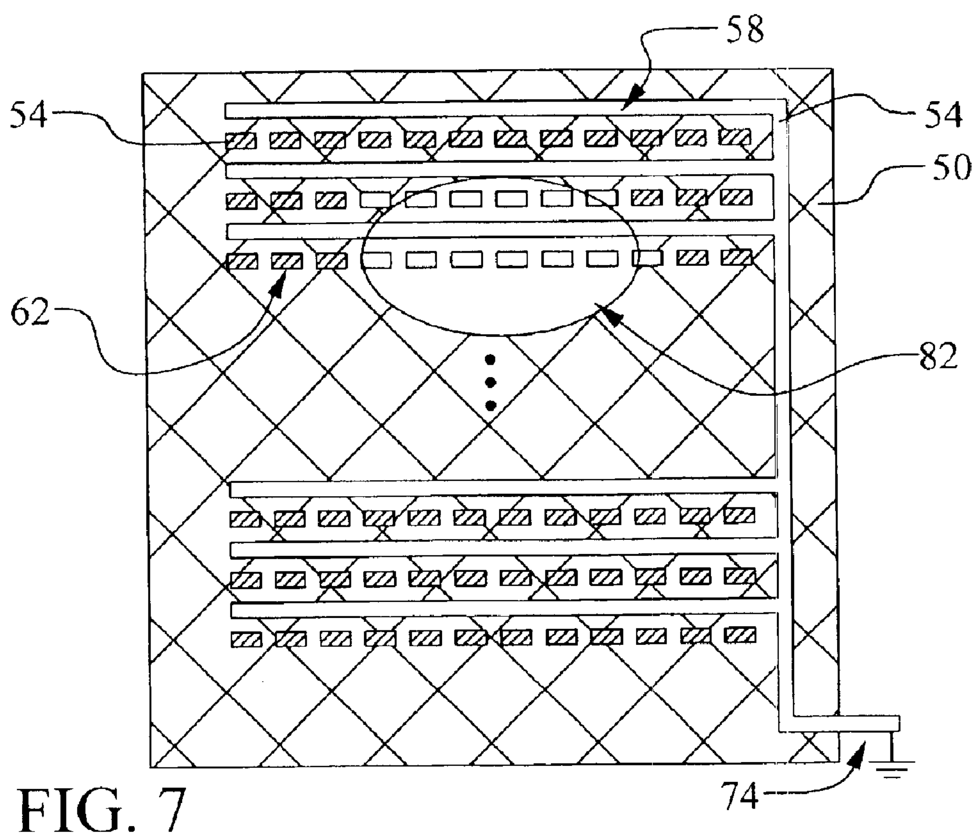

Referring now to FIGS. 6 and 7, the first preferred embodiment is applied to a damascene process where the conductive layer is defined by polishing. As described above, the conductive layer 54 may be defined by a damascene polishing process. This is particularly useful where the conductive layer 54 comprises copper due to the difficulty in etching copper. Note that the same test structure can be used for either the etching or the polishing process.

In the case of chemical mechanical polishing (CMP), a polishing head and a slurry material are used to remove the conductive layer 54. A common problem in the CMP process is residue leftover. Residue is a form of under polishing, or non-uniform polishing, wherein a section 82 of the metal layer 54 remains after the polishing step is completed. Referring now to FIG. 7, the residue 82 is easily detected and located using the same PVC technique discussed above in FIG. 5.

Figure 8:
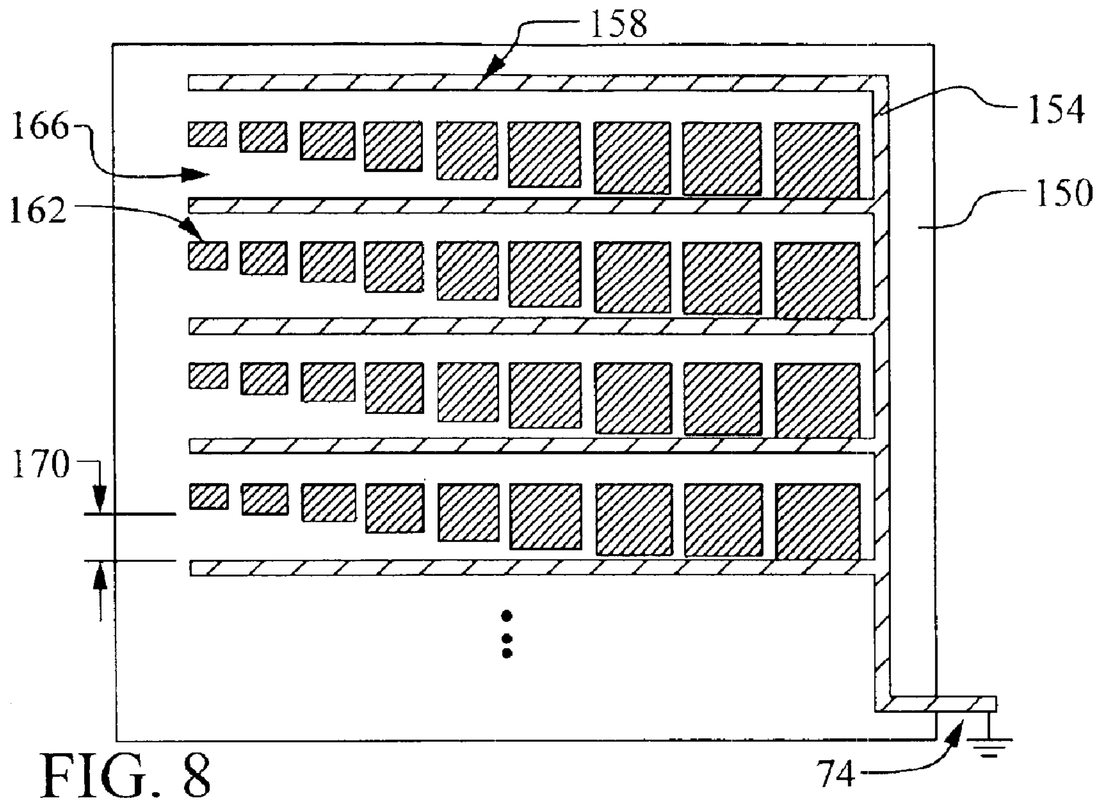
FIGS. 8 and 9 illustrate a third preferred embodiment of the present invention showing a novel test structure to measure critical dimensions of a patterned conductive layer.
Figure 9:
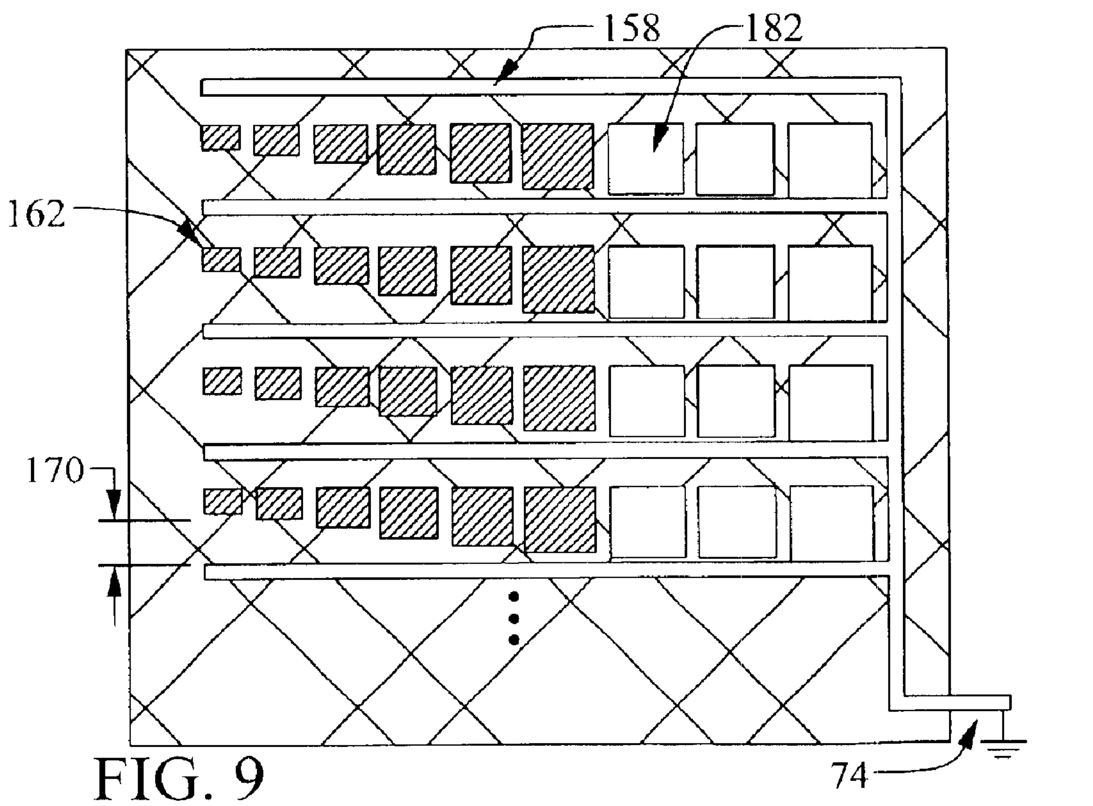

Referring now to FIGS. 8 and 9, a third preferred embodiment of the present invention is illustrated. In this embodiment, a novel test structure is disclosed for measuring critical dimensions of a patterned conductive layer.

Critical dimensions (CD) are defined as measurements that are taken on structures that are formed by photo or etch steps. For example, the width of polysilicon lines are monitored as a critical dimension. Typically, CD measurement is performed using an optical measurement system, such as a KLA machine. However, the novel test structure and method of the present invention provides a quicker alternative to monitor CD spacings on conductive layers.

In any technology or process development, it is important to know the margin or limitations on the smallest CD's that can be produced. The smaller the CD, the faster the chip. However, the previous art of checking the CD or process margin requires a much longer process of testing at the end of the process cycle. which can take as long as one month. This proposed structure hs the benefit of checking the CD margin in-line and can effectively reduce technology development time substantially.

Referring particularly to FIG. 8, the novel CD test structure comprises a single, conductive layer 154. As a first important feature, a line 158 is patterned in this conductive layer 154. The line 158 preferably further comprises a network such as the two-dimensional branching pattern shown. In this branching pattern 158, a series of lines are commonly coupled such that the entire pattern 158 is coupled to ground 174. This ground coupling 174 may be formed in the conductive layer 154 only or may comprise contact or via structures along with additional levels of interconnect material. In a simplest embodiment, a single line could be coupled to ground 174 to form the line 158 portion of the structure.

As a second important feature, a plurality of rectangles 162 are patterned in the conductive layer 154. These rectangles 162 are designed to be non-connected with each other and with the line network 158. That is, each rectangle 162 is an island. Therefore, each rectangle is floating with respect to the ground reference 174 of the circuit. In addition, the rectangles 162 and the lines 158 are closely spaced. The near edges, that is the closest edges of each rectangle 162 and it nearest, adjacent line or lines 158, are formed in parallel 166. Finally, the distance 170 between the near edges of the rectangles 162 and the line or lines 158 are preferably not a constant value. This is a key difference between the first and third embodiments. More preferably, the distance 170 varies across a range of values that include the minimum spacing value for the conductive layer 154 in the manufacturing process.

The novel test structure of the third preferred embodiment may comprise any conductive material. For example, the conductive layer 154 may comprise a metal layer such as aluminum, copper, or an alloy of aluminum and/or copper. Other metals or composite materials could be-used. Further, such a conductive layer 154 could be patterned using either etching or polishing as discussed above. A further preferred material for the conductive layer 154 is polysilicon. Polysilicon is frequently used in the art to define MOS gates, resistors, and interconnecting lines. Polysilicon and, more preferably, doped polysilicon is a conductor. It is therefore possible to analyze a polysilicon pattern using the PVC method. The test structure is preferably designed into the masking reticle for the conductive layer 154. For example, the test structure may be designed into the polysilicon mask. Alternatively, the test structure may be designed into any of the metal masks in the process. After the conductive layer 154 is defined by etching or by polishing, the test structure is completed. At this point, it is likely that some of the most closely spaced rectangles 162 will be shorted to the line network 158.

Referring now to FIG. 9, an exemplary test result using the novel testing structure is shown. In this example, the conductive layer 154 is patterned using the etching method described above. However, the method would work similarly for a damascene process. Following the etching step, the wafer is loaded into a SEM system. Further, the wafer is grounded. Note that the grounding 174 on the test structure is configured such that grounding the substrate will result in grounding the line network 158 of the test structure. This is an important feature of the present invention. It is not necessary to probe the integrated circuit device during the test. The test structure is then exposed to the primary electron beam. More specifically, the electron beam is scanned the test structure. Secondary emitted electrons are captured and converted into an image by the SEM. The PVC effect, as described above, causes the grounded line network 154 to light or glow on the image. If the etching process has isolated all of the rectangles 162 from the line network 158, then only the line network 158 will be lit. The rectangles 162 will remain dark.

However, it is likely that some of the closest rectangles 182 will be shorted to the line 158. This will cause these rectangles 182, only, to be lit along with the line network 158. The remaining rectangles 162 will remain dark. This observation can be used to define a quick measurement of the CD spacing for the conductive layer 154. The designed spacing 170 of each rectangle in the array is known. Therefore, by observing the rectangles 182 that are shorted and, more particularly, the smallest spacing that is not shorted, process engineering can quickly determine how close the process is running to the target CD. The technique allows the CD to be quickly measured without a visual inspection tool. In this way, a quick process margin check can be implemented in the production line.

Figure 10:
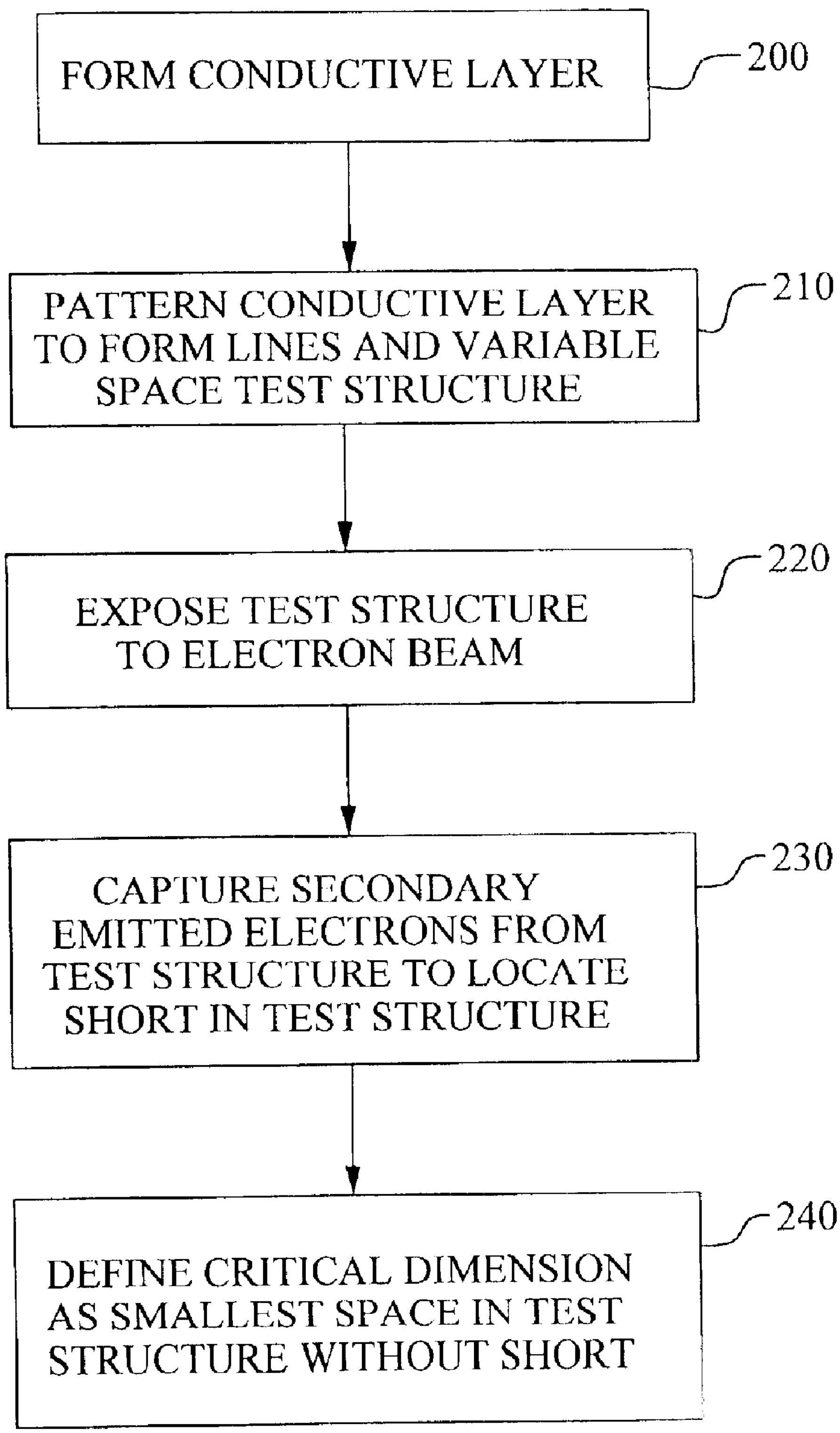
FIG. 10 illustrates a fourth preferred embodiment of the present invention showing a novel test method to measure critical dimensions.

Referring now to FIG. 10, a fourth preferred embodiment of the present invention shows the novel test method to measure critical dimensions of a conductive layer using PVC. First, a conductive layer is formed overlying the substrate in step 200. Second, this conductive layer is patterned in step 210. This patterning may be by etching or by damascene polishing. During the patterning step 110, the conductive lines of the circuit are formed as well as the novel test structure of the third preferred embodiment of the present invention. Third, the test structure is exposed to an electron beam in step 220. This step 220 is preferably performed in a type of SEM system. The exposure most preferably involves scanning the electron beam on the test structure. Fourth, emitted secondary electrons are captured and converted to a video image to locate line defects in step 230. Finally, the critical dimension is defined as the smallest space in the test structure that is not lit or shorted to the grounded line.

The advantages of the present invention may now be summarized. An effective and very manufacturable test structure and method to locate interconnect defects in an integrated circuit device is achieved. Bridging defects may be located, using the structure, in an interconnect layer using PVC. The test structure is effective for conductive levels patterned by etching or by chemical mechanical polishing. A method to detect bridging defects using PVC and the novel test structure is achieved. The testing method does not require probing. A test structure for measuring critical dimensions in a conductive layer using PVC is achieved. A method to measure critical dimensions in a conductive layer using the novel test structure is achieved. The test structure and method for measuring critical dimensions using PVC are effective for conductive levels patterned by etching or by chemical mechanical polishing.

As shown in the preferred embodiments, the novel structures and methods of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A test structure to measure critical dimension in a conductive layer of an integrated circuit device, said test structure comprising:

a line comprising a conductive layer overlying a substrate wherein said line is coupled to ground; and a plurality of rectangles comprising said conductive layer wherein said rectangles are not connected to said line or to other said rectangles, wherein near edges of said rectangles and of said line are parallel, wherein said rectangles are floating, wherein the spaces between said near edges of said rectangles and said line vary over a range of values including the critical dimension value for a process step, and wherein any said rectangle that is shorted to said line will be detected distinctly at said shorted rectangle location by exposing an electron beam to said line and then capturing emitted secondary electrons from said line and said rectangles such that said line and said shorted rectangle have a common emission level while nearby rectangles have a differing said emission level.

2. The test structure according to claim 1 wherein said conductive layer comprises metal.

3. The test structure according to claim 1 wherein said conductive layer comprises polysilicon.

4. The test structure according to claim 1 wherein said line comprises a two-dimensional, branching pattern.

5. The test structure according to claim 1 wherein said coupling to ground comprises additional layers.

6. The test structure according to claim 1 wherein said near edges are spaced by a constant value.

7. The test structure according to claim 1 wherein said near edges are spaced by non-constant values.

8. A method to measure critical dimension in a conductive layer of an integrated circuit device, said method comprising:

providing a conductive layer overlying a substrate;

patterning said conductive layer to form lines and to form a test structure wherein said test structure comprises:

a line comprising said conductive layer overlying said substrate wherein said line is coupled to ground; and a plurality of rectangles comprising said conductive layer wherein said rectangles are not connected to said line or to other said rectangles, wherein near edges of said rectangles and of said line are parallel, wherein said near edges are spaced by a constant value, wherein said rectangles are floating, wherein the spaces between said near edges of said rectangles and said line vary over a range of values including the critical dimension value for a process step;

exposing said test structure to an electron beam; and capturing emitted secondary electrons from said test structure to measure critical dimension by passive voltage contrast wherein any said rectangle shorted to said line will be detected distinctly at said shorted rectangle location because said line said shorted rectangle have a common emission level while nearby rectangles have a differing said emission level.

9. The method according to claim 8 wherein said conductive layer comprises metal.

10. The method according to claim 8 wherein said conductive layer comprises polysilicon.

11. The method according to claim 8 wherein said line comprises a two-dimensional, branching pattern.

12. The method according to claim 8 wherein said coupling to ground comprises additional layers.

13. The method according to claim 8 wherein said patterning comprises etching through said conductive layer.

14. The method according to claim 8 wherein said bridging defects comprise inadequate etching of said conductive layer.

15. The method according to claim 8 wherein said patterning comprises polishing down said conductive layer to conform to predefined trenches.

16. The method according to claim 8 wherein said bridging defects comprise inadequate polishing of said conductive layer.

17. A method to measure critical dimensions in a conductive layer of an integrated circuit device, said method comprising:

providing a conductive layer overlying a substrate;

patterning said conductive layer to form lines and to form a test structure wherein said test structure comprises:

a line comprising said conductive layer overlying said substrate wherein said line is coupled to ground; and a plurality of rectangles comprising said conductive layer wherein said rectangles are not connected to said line or to other said rectangles, wherein near edges of said rectangles and of said line are parallel, wherein said near edges are spaced by non-constant values, wherein said rectangles are floating, wherein the spaces between said near edges of said rectangles and said line vary over a range of values including the critical dimension value for a process step;

exposing said test structure to an electron beam;

capturing emitted secondary electrons from said test structure to locate short in said test structure by passive voltage contrast wherein any said rectangle shorted to said line will be detected distinctly at said shorted rectangle location because said line said shorted rectangle have a common emission level while nearby rectangles have a differing said emission level; and determining critical dimension as smallest said space without said short.

18. The method according to claim 17 wherein said conductive layer comprises metal.

19. The method according to claim 17 wherein said conductive lager comprises polysilicon.

20. The method according to claim 17 wherein said line comprises a two-dimensional, branching pattern.

21. The method according to claim 17 wherein said coupling to ground comprises additional layers.

22. The method according to claim 17 wherein said patterning comprises etching through said conductive layer.

23. The method according to claim 17 wherein said critical dimensions comprise spaces between lines of said conductive layer due to etching.

24. The method according to claim 17 wherein said patterning comprises polishing down said conductive layer to conform to predefined trenches.

25. The method according to claim 17 wherein said critical dimensions comprise spaces between lines of said conductive layer due to polishing down.

* * * * *